(12) United States Patent
Pan

(10) Patent No.: US 11,133,041 B1
(45) Date of Patent: Sep. 28, 2021

(54) MEMORY AND CALIBRATION AND OPERATION METHODS THEREOF FOR READING DATA IN MEMORY CELLS

(71) Applicant: Wuxi Petabyte Technologies Co., Ltd., Wuxi (CN)

(72) Inventor: Feng Pan, Fremont, CA (US)

(73) Assignee: WUXI PETABYTE TECHNOLOGIES CO, LTD., Jiangsu (CN)

( * ) Notice: Subject to any disclaimer, the term of this patent is extended or adjusted under 35 U.S.C. 154(b) by 0 days.

(21) Appl. No.: 16/847,629

(22) Filed: Apr. 13, 2020

(51) Int. Cl.
*G11C 7/22* (2006.01)
*G11C 7/06* (2006.01)
*G11C 7/10* (2006.01)
*G11C 29/02* (2006.01)

(52) U.S. Cl.
CPC .......... *G11C 7/22* (2013.01); *G11C 7/06* (2013.01); *G11C 7/1066* (2013.01); *G11C 7/1093* (2013.01); *G11C 29/021* (2013.01); *G11C 29/023* (2013.01); *G11C 2207/2254* (2013.01)

(58) Field of Classification Search
None
See application file for complete search history.

(56) References Cited

U.S. PATENT DOCUMENTS

| | | | |
|---|---|---|---|
| 9,312,747 B1* | 4/2016 | Svorc | G05F 3/262 |
| 2004/0008536 A1* | 1/2004 | Garni | G11C 11/16 |
| | | | 365/171 |
| 2005/0264344 A1* | 12/2005 | Kim | H04W 52/028 |
| | | | 327/538 |
| 2007/0171732 A1* | 7/2007 | Lin | B82Y 10/00 |
| | | | 365/189.14 |
| 2014/0312963 A1* | 10/2014 | Berkhout | G05F 3/262 |
| | | | 327/543 |
| 2016/0147246 A1* | 5/2016 | Svorc | G05F 3/262 |
| | | | 323/315 |

* cited by examiner

*Primary Examiner* — J. H. Hur
(74) *Attorney, Agent, or Firm* — Bayes PLLC

(57) ABSTRACT

Embodiments of a memory, and calibration and operation methods thereof for reading data in memory cells are disclosed. In an example, an apparatus comprises transistors, and a charge sharing circuit coupled to the transistors through gate terminals of the transistors. The charge sharing circuit comprises a programmable electrical source, a first switch coupled to the programmable electrical source, a capacitor coupled to the first switch, and a second switch coupled to the capacitor, the first switch, and the gate terminals of the transistors. The programmable electrical source is configured to provide electrical charges to the capacitor when the first switch is turned on and the second switch is turned off. The capacitor is configured to provide at least a portion of the electrical charges to the gate terminals of the transistors when the first switch is turned off and the second switch is turned on.

19 Claims, 9 Drawing Sheets

MEMORY AND CALIBRATION AND OPERATION METHODS THEREOF FOR READING DATA IN MEMORY CELLS

BACKGROUND

Embodiments of the present disclosure relate to a memory, for example, a ferroelectric memory, and calibration and operation methods thereof for reading data in memory cells in the memory.

The ferroelectric memory, such as a ferroelectric Random Access Memory (FeRAM or FRAM), uses a ferroelectric material layer to achieve non-volatility. A ferroelectric material has a nonlinear relationship between the applied electric field and the apparent stored charge and thus, can switch polarity in an electric field. Ferroelectric memory's advantages include low power consumption, fast read/write performance, and great maximum read/write endurance.

BRIEF SUMMARY

Embodiments of a memory, for example, a ferroelectric memory, and calibration and operation methods thereof for reading data in memory cells, for example, ferroelectric memory cells, are disclosed herein.

In one example, an apparatus is disclosed. The apparatus comprises a plurality of transistors, and a charge sharing circuit coupled to the plurality of transistors through a plurality of gate terminals of the plurality of transistors. The charge sharing circuit comprises a programmable electrical source, a first switch coupled to the programmable electrical source, a capacitor coupled to the first switch, and a second switch coupled to the capacitor, the first switch, and the plurality of gate terminals of the plurality of transistors. The programmable electrical source is configured to provide electrical charges to the capacitor when the first switch is turned on and the second switch is turned off. The capacitor is configured to provide at least a portion of the electrical charges to the plurality of gate terminals of the plurality of transistors when the first switch is turned off and the second switch is turned on.

In some embodiments, the apparatus further comprises a coordination circuit coupled to the charge sharing circuit, the coordination circuit configured to apply a set of values on one or more parameters corresponding to the charge sharing circuit.

In some embodiments, the one or more parameters corresponding to the charge sharing circuit are selected from a group consisting of an amplitude of a voltage outputted by the programmable electrical source, a capacitance of the capacitor, a first time to turn on the first switch and turn off the second switch, a first period of time for turning on the first switch and turning off the second switch, a second time to turn on the second switch and turn off the first switch, and a second period of time for turning on the second switch and turning off the first switch.

In some embodiments, the apparatus further comprises a first reference memory cell storing a bit of 1, a second reference memory cell storing a bit of 0, and a reference circuit coupled to the plurality of transistors through the gate terminals of the plurality of transistors, coupled to the first reference memory cell through a first reference bit line, and coupled to the second reference memory cell through a second reference bit line. In some embodiments, the plurality of transistors are grounded through a plurality of source terminals of the plurality of transistors. In some embodiments, the plurality of transistors are configured to generate, together with the reference circuit, a plurality of reference currents, and provide the plurality of reference currents.

In some embodiments, the apparatus further comprises a reference circuit coupled to the plurality of transistors through the gate terminals of the plurality of transistors. The reference circuit comprises a first reference memory cell storing a bit of 1, and a second reference memory cell storing a bit of 0. The plurality of transistors are grounded through a plurality of source terminals of the plurality of transistors and are configured to generate, together with the reference circuit, a plurality of reference currents, and provide the plurality of reference currents.

In some embodiments, the apparatus further comprises a plurality of memory cells, each of the plurality of memory cells storing a bit selected from a group consisting of a first bit and a second bit which is different from the first bit, a plurality of voltage-to-current converters coupled to the plurality of memory cells, the plurality of voltage-to-current converters configured to convert a plurality of voltages of data sensed from the plurality of memory cells to a plurality of currents, and a plurality of current comparator circuits coupled to the plurality of voltage-to-current converters and the plurality of transistors through a plurality of drain terminals of the plurality of transistors, each of the plurality of current comparator circuits configured to output a respective output data based on a respective current provided by a respective voltage-to-current converter of the plurality of voltage-to-current converters and a respective reference current provided by a respective transistor of the plurality of transistors.

In some embodiments, each of the plurality of current comparator circuits comprises a sense amplifier. In some embodiments, the respective output data is a bit of 1 when the respective current is smaller than the respective reference current. In some embodiments, the respective output data is a bit of 0 when the respective current is greater than or equal to the respective reference current. In some embodiments, the plurality of memory cells are a plurality of ferroelectric memory cells.

In another example, a method is disclosed. A first set of values is applied on one or more first parameters corresponding to one or more components of a charge sharing circuit, wherein the one or more components are selected from a group consisting of a programmable electrical source, a first switch coupled to the programmable electrical source, a capacitor coupled to the first switch, and a second switch coupled to the first switch and the capacitor. First electrical charges from the programmable electrical source are provided to the capacitor by turning on the first switch and turning off the second switch based on the one or more first parameters. At least a portion of the first electrical charges is provided from the capacitor to a plurality of gate terminals of a plurality of transistors by turning off the first switch and turning on the second switch based on the one or more first parameters. Data in a plurality of memory cells is determined using the plurality of transistors after the at least a portion of the first electrical charges is provided to the plurality of gate terminals of the plurality of transistors.

In some embodiments, the one or more parameters corresponding to the charge sharing circuit are selected from a group consisting of an amplitude of a voltage outputted by the programmable electrical source, a capacitance of the capacitor, a first time to turn on the first switch and turn off the second switch, a first period of time for turning on the first switch and turning off the second switch, a second time to turn on the second switch and turn off the first switch, and a second period of time for turning on the second switch and turning off the first switch.

In some embodiments, the first set of values for the one or more first parameters corresponding to the one or more components of the charge sharing circuit is determined. First data from the plurality of memory cells is sensed, each of the first data corresponding to a first bit. Measurements of first currents converted from voltages of the first data are obtained. Second data from the plurality of memory cells is sensed, each of the second data corresponding to a second bit which is different from the first bit. Measurements of second currents converted from voltages of the second data are obtained. The first set of values of the one or more first parameters corresponding to the one or more components of the charge sharing circuit is adjusted until each of a plurality of reference currents provided by the plurality of transistors is within a predetermined range of a nominal value determined based on the measurements of first currents and the measurements of second currents.

In some embodiments, the nominal value is determined by dividing one half of a sum of the measurements of first currents and the measurements of second currents by a number of memory cells included in the plurality of memory cells.

In some embodiments, the first switch and the second switch are both N-type metal oxide semiconductor field effect (NMOS) transistors.

In some embodiments, a second set of values is applied on one or more second parameters corresponding to the one or more components of the charge sharing circuit when the plurality of transistors reach steady states. Second electrical charges are provided from the programmable electrical source to the capacitor by turning on the first switch and turning off the second switch based on the one or more second parameters. At least a portion of the second electrical charges to the plurality of gate terminals of the plurality of transistors by turning off the first switch and turning on the second switch based on the one or more second parameters.

In some embodiments, the plurality of memory cells are a plurality of ferroelectric memory cells. In some embodiments, the one or more second parameters are the one or more first parameters. In some embodiments, the data in the plurality of memory cells is determined after the at least a portion of the second electrical charges is provided to the plurality of gate terminals of the plurality of transistors.

In yet another example, another method is disclosed. First data from a plurality of memory cells is sensed, each of the first data corresponding to a first bit. Measurements of first currents converted from voltages of the first data are obtained. Second data from the plurality of memory cells is sensed, each of the second data corresponding to a second bit which is different from the first bit. Measurements of second currents converted from voltages of the second data are obtained. One or more parameters corresponding to one or more components of a charge sharing circuit are adjusted until each of a plurality of reference currents provided by a plurality of transistors is within a predetermined range of a nominal value determined based on the measurements of first currents and the measurements of second currents.

In some embodiments, the one or more components of the charge sharing circuit are selected from a group consisting of a programmable electrical source, a first switch coupled to the programmable electrical source, a capacitor coupled to the first switch, and a second switch coupled to the first switch, the capacitor, and a plurality of gate terminals of the plurality of transistors, and wherein the plurality of gate terminals of the plurality of transistors are electrically connected.

In some embodiments, the one or more parameters corresponding to the charge sharing circuit are selected from a group consisting of an amplitude of a voltage outputted by the programmable electrical source, a capacitance of the capacitor, a first time to turn on the first switch and turn off the second switch, a first period of time for turning on the first switch and turning off the second switch, a second time to turn on the second switch and turn off the first switch, and a second period of time for turning on the second switch and turning off the first switch.

In some embodiments, the nominal value is determined by dividing one half of a sum of the measurements of first currents and the measurements of second currents by a number of memory cells included in the plurality of memory cells.

In some embodiments, a measurement of voltage at any gate terminal of the plurality of transistors is obtained after each of the plurality of reference currents is determined within the predetermined range of the nominal value.

In some embodiments, the first switch and the second switch are both NMOS transistors.

In some embodiments, the plurality of memory cells are a plurality of ferroelectric memory cells. In some embodiments, the second bit is a bit of 1 when the first bit is a bit of 0, and wherein the second bit is the bit of 0 when the first bit is the bit of 1.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
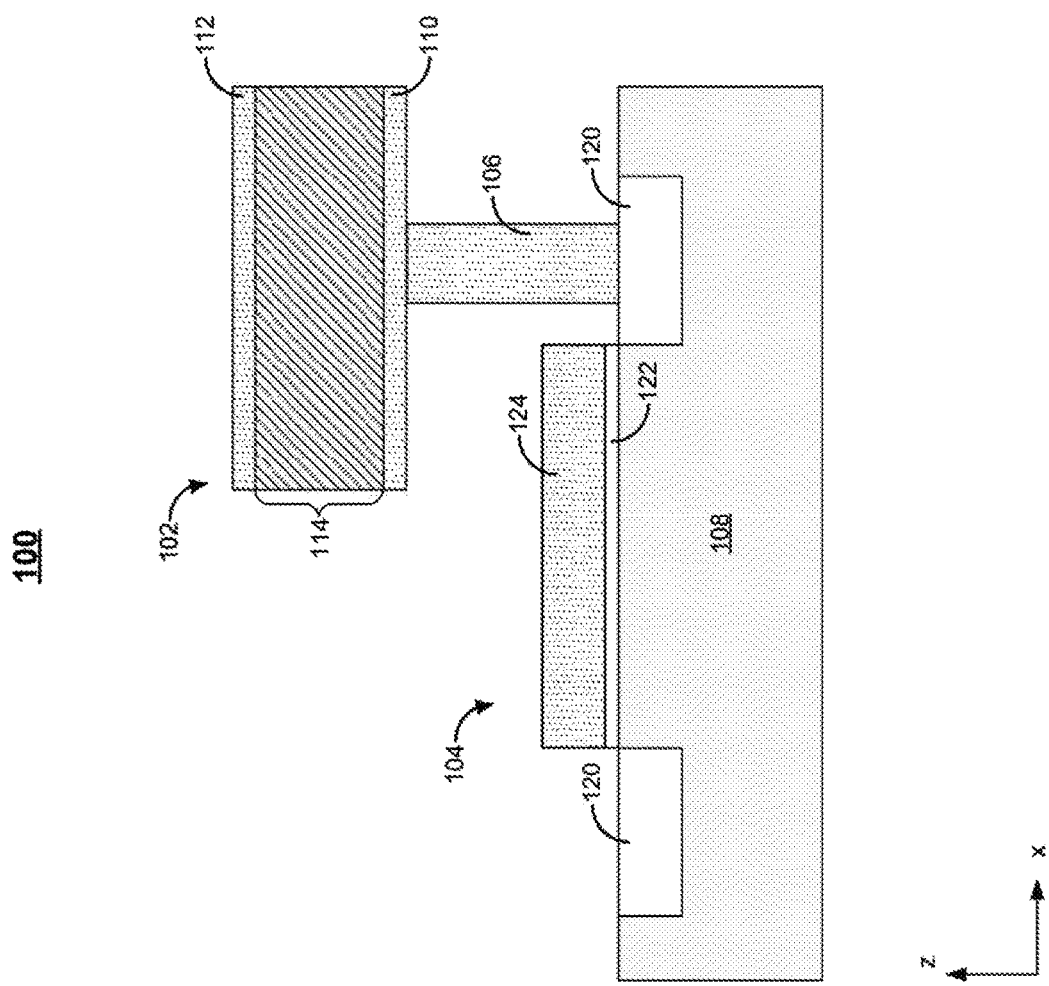
FIG. 1 illustrates a cross-section of an exemplary ferroelectric memory cell, according to some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

Traditional ferroelectric memory is targeting extremely high endurance application, like $10^{13}$ or higher read/write cycles. In order to achieve this extreme metrics, cell size, sensing margin, and timing are optimized for the end of life condition. For normal applications, acceptable high endurance, high performance, low power, non-volatile, and small cell size are expected in embedded or stand-alone applications. Further to bridge the performance gap between ferroelectric memory and static random-access memory (SRAM) or dynamic random-access memory (DRAM), high speed, good endurance, lower power, non-volatile, and small cell size memories are needed for flerroelectric memory.

FIG. 1 illustrates a cross-section of an exemplary ferroelectric memory cell 100, according to some embodiments of the present disclosure. Ferroelectric memory cell 100 is the basic storage element of a ferroelectric memory device and can include various designs and configurations. As shown in FIG. 1, ferroelectric memory cell 100 is a "1T-1C" cell that includes a capacitor 102, a transistor 104, and an interconnect 106 between capacitor 102 and transistor 104 formed on a substrate 108.

In some embodiments, capacitor 102 includes a lower electrode 110, an upper electrode 112, and a ferroelectric layer 114 disposed vertically between lower electrode 110 and upper electrode 112. Ferroelectric layer 114 can be in contact with and electrically connected to lower electrode 110 on a lower surface and in contact with and electrically connected to upper electrode 112 on an upper surface. Lower electrode 110 can be electrically connected to transistor 104 through interconnect 106, and upper electrode 112 can be electrically connected to a voltage source (not shown), such that an electrical field can be applied to ferroelectric layer 114. For ease of description, the example of a 1T-1C cell is illustrated in the present disclosure. In various embodiments, ferroelectric layer 114 can be used in any other suitable types of ferroelectric memory cells with more than one capacitor per cell. For example, ferroelectric layer 114 can also be used in a "2T-2C" cell or an "nT-mC" cell (where n and m are integers). The type of ferroelectric memory cells (e.g., the number of capacitors in a single memory cell) should not be limited by the embodiments of the present disclosure.

In some embodiments, transistor 104 includes source/drain regions 120 and a gate stack having a gate dielectric 122 and a gate conductor 124. Source/drain regions 120 can be doped regions in substrate 108 with n-type or p-type dopants at a desired doping level. Gate dielectric 122 can include dielectric materials, such as silicon oxide (SiO), silicon nitride (SiNx) or high-k dielectric materials. Gate conductor 124 can include conductive materials. Gate conductor 124 can function as the word line of ferroelectric memory cell 100. An interconnect (not shown) can be in contact with one of source/drain regions 120 that is not in contact with interconnect 106 and function as the bit line of ferroelectric memory cell 100. It is understood that the ferroelectric memory cells disclosed herein are not limited to the example shown in FIG. 1 and may include any planar ferroelectric memory cells or 3D ferroelectric memory cells in any suitable configurations.

Figure 2A:
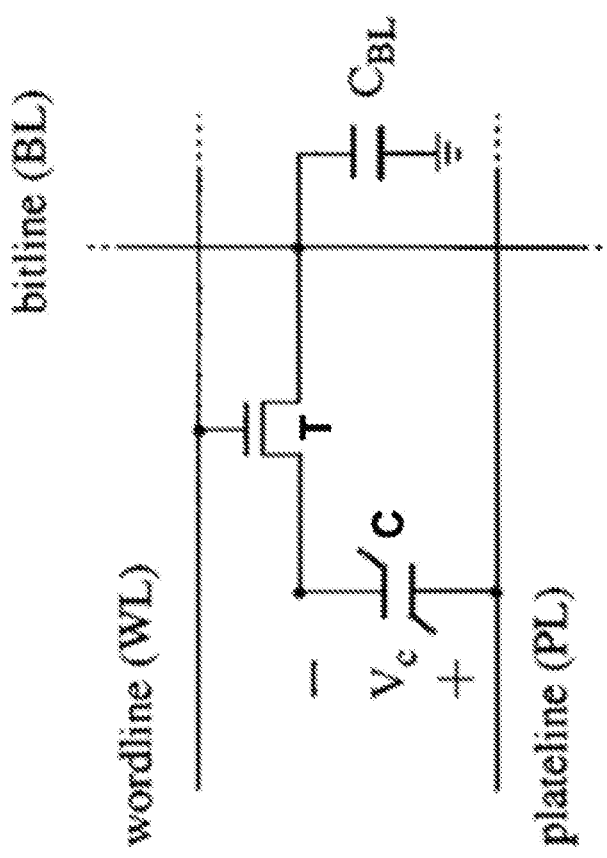
FIG. 2A illustrates a circuit diagram of an exemplary ferroelectric memory cell, according to some embodiments of the present disclosure.

FIG. 2A illustrates a circuit diagram of an exemplary ferroelectric memory cell, according to some embodiments of the present disclosure. The ferroelectric memory cell may be a 1T-1C ferroelectric memory cell, such as ferroelectric memory cell 100 in FIG. 1. The gate of the transistor T is electrically connected to a word line (WL). In some embodiments, the source of the transistor T is electrically connected to a bit line (BL), and the drain of the transistor T is electrically connected to one electrode of the capacitor C. In some embodiments, the drain of the transistor T is electrically connected to the BL, and the source of the transistor T is electrically connected to the one electrode of the capacitor C. The other electrode of the capacitor C is electrically connected to a plate line (PL), which can apply a voltage $V_C$ across the capacitor C as shown in FIG. 2A. "$C_{BL}$" represents the total parasitic capacitance of the bit line.

Figure 2B:
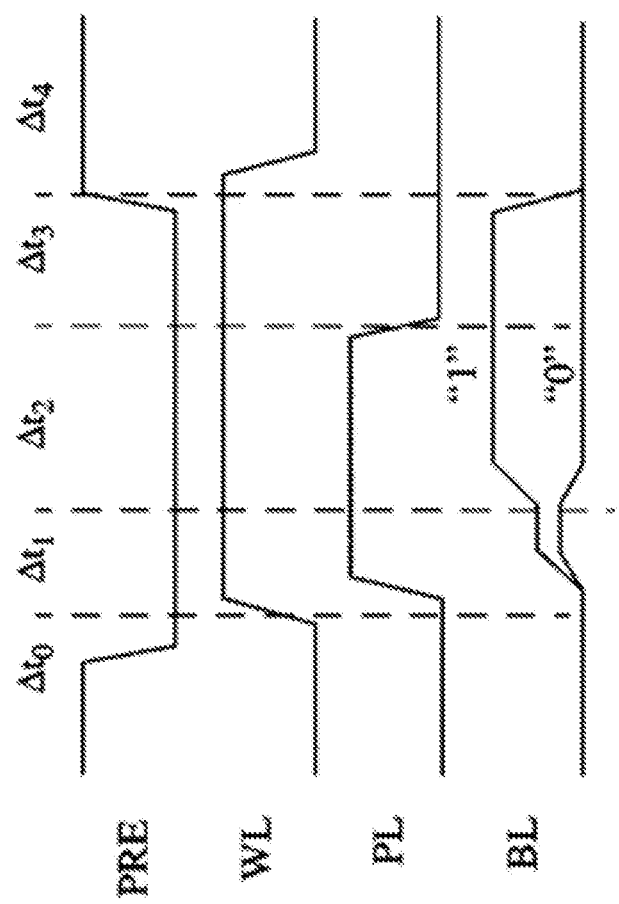
FIG. 2B illustrates a timing diagram of an exemplary read operation of the ferroelectric memory cell in FIG. 2A, according to some embodiments of the present disclosure.

FIG. 2B illustrates a timing diagram of an exemplary read operation of the ferroelectric memory cell in FIG. 2A, according to some embodiments of the present disclosure. The read operation of the ferroelectric memory cell, which is selected by the positive WL signal, in FIG. 2A includes two steps. In the first step, the PL signal is positive, and the data in the ferroelectric memory cell (e.g., the charge stored in the capacitor C) is sensed through the BL voltage. As the read operation of ferroelectric memory is "destructive read," which alters the contents of the accessed memory location and needs to be immediately followed by a rewriting of the contents back to the same memory location in order to preserve them, in the second step, the PL signal stays high for writing "0," then becomes negative for writing "1," and the sensed data is written back to the ferroelectric memory cell.

As to the write operation of the ferroelectric memory cell, in one example, it also includes two steps: multiple pieces of data are simultaneously sensed from multiple ferroelectric memory cells (e.g., in the same page) in the first step; in the second step, the new data is written to the target ferroelectric memory cell, and other pieces of original data are simultaneously written back to other ferroelectric memory cells in the same page. In another example, additional decoding circuits may be utilized to free the first step, such that the new data can be written to the target ferroelectric memory cell without the prior sensing step.

As described above, normal ferroelectric memory read operations require both sensing and writing-back steps. In terms of performance, the two steps consume similar amount of time due to signal controls. Thus, ferroelectric memory performance in theory should be the same as that of comparable DRAM (e.g., both having 1T-1C configurations).

Various embodiments in accordance with the present disclosure provide a memory and calibration and operation methods thereof for reading data in memory cells are disclosed herein. In some embodiments, the memory is a ferroelectric memory and the memory cells are ferroelectric memory cells. The memory includes a charge sharing circuit coupled to a plurality of transistors through a plurality of gate terminals of the plurality of transistors. Each of the plurality of transistors corresponds to one of the memory cells. Proper operation of a regular memory for reading the data in the memory cells requires to wait for a period of time until the plurality of transistors reach steady states (for example, the gate voltage shared by the plurality of transistors reaches a corresponding voltage when the plurality of transistors operate at the steady states). Such period of time may also be referred to as settling time. When there is a large number of memory cells in the memory, the settling time can be very long. Accordingly, the speed of the memory for reading data in the memory cells seems very slow due to the long settling time of the reference voltage as a result of the very small magnitude of FRAM cell current (or slew rate). By providing electrical charges from the charge sharing circuit to the plurality of gate terminals of the plurality of transistors, the settling time (specifically, the reference voltage settling time) can be greatly reduced. Thus, the speed of reading the data in the memory cells can be dramatically improved. Each of the plurality of memory cells may have any appropriate number of transistors and capacitors. In some embodiments, each of the plurality of memory cells as disclosed herein can be a 1T-1C cell, which has a much smaller die size than an iT-jC cell (both i and j are integers and greater than 1), including without limitation, 2T-2C cells, which are widely used in the industry. Therefore, the memory including 1T-1C cells allows for higher integration density of memory cells than other memory architectures. Further, calibration and operation methods with respect to the memory using the charge sharing circuit are disclosed. The calibration method can be employed to calibrate the memory by compensating mismatch and offset caused by one or more components in the memory, thus improving the reliability of the memory. The operation method, which may be based on data obtained from the calibration method, allows the memory for a higher degree of performance in terms of speed and accuracy for reading data in the memory cells.

Figure 3:
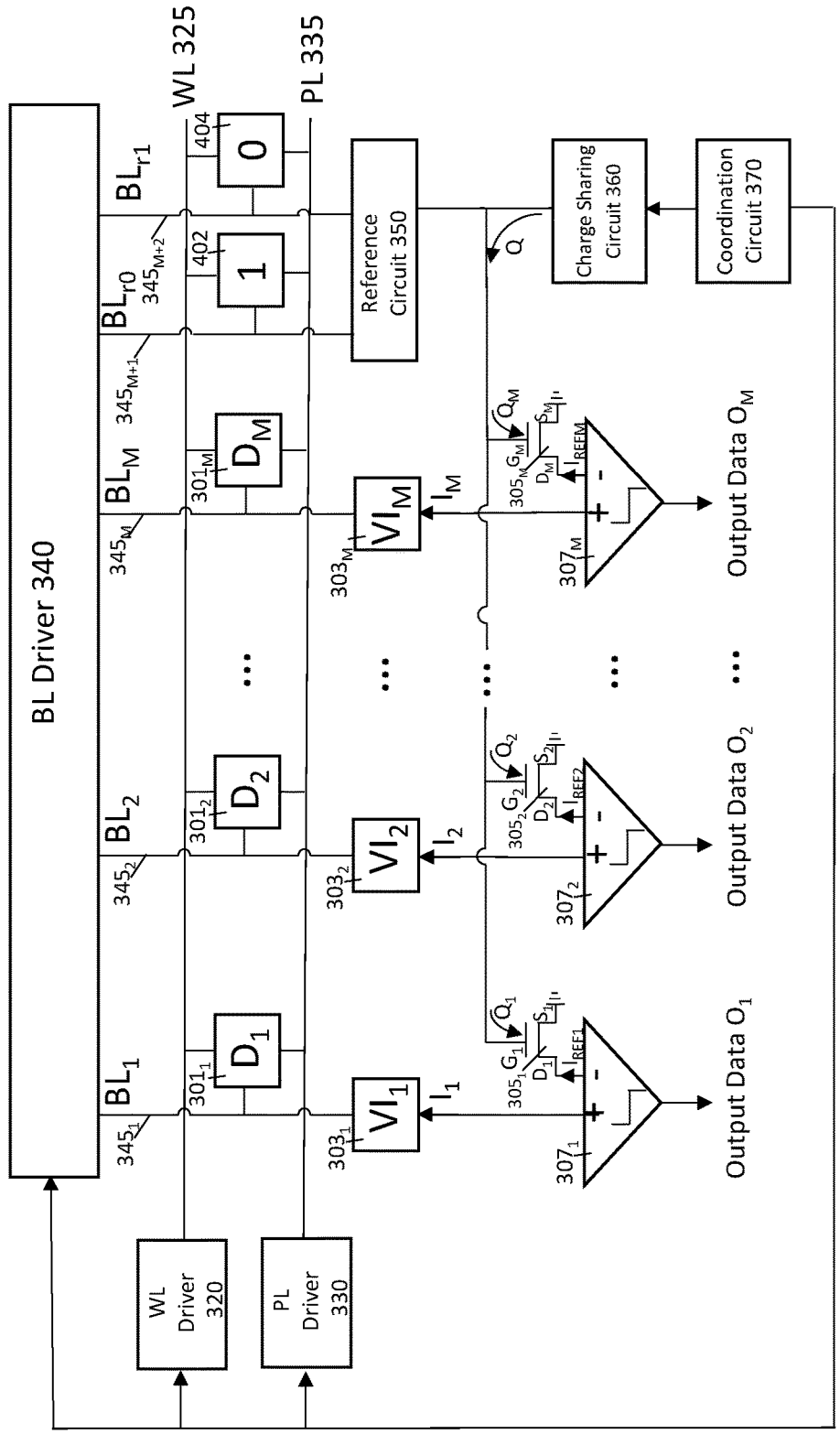
FIG. 3 illustrates a circuit diagram of an exemplary memory including without limitation a plurality of memory cells, a reference circuit, and a charge sharing circuit, according to some embodiments of the present disclosure.

FIG. 3 illustrates a circuit diagram of an exemplary memory 300, according to some embodiments of the present disclosure. In some embodiments, the memory 300 is a ferroelectric memory. In some embodiments, the memory 300 is a ferroelectric Random Access Memory (FeRAM or FRAM).

The memory 300 includes a word line 325 (denoted by WL), a plate line 335 (denoted by PL), and (M+2) bit lines $345_{1, 2, \ldots, M, M+1, M+2}$ (denoted by $BL_{1, 2, \ldots, M, r0, r1}$). M is a positive integer. In some embodiments, M can be any positive integer. In some embodiments, the bit lines $BL_{r0}$ $345_{M+1}$ and $BL_{r1}$ $345_{M+2}$ are also referred to as a first reference bit line and a second reference bit line, respectively.

As shown in FIG. 3, the memory 300 includes a plurality of memory cells $301_{1, 2, \ldots, M}$, denoted by $D_{1, 2, \ldots, M}$. In some embodiments, the plurality of memory cells $301_{1, 2, \ldots, M}$ are a plurality of ferroelectric memory cells. In some embodiments, the plurality of memory cells $301_{1, 2, \ldots, M}$ are 1T-1C cells. In some embodiments, each of the plurality of memory cells $301_{1, 2, \ldots, M}$ is the ferroelectric memory cell 100.

In some embodiments, each of the plurality of memory cells $301_{1, 2, \ldots, M}$ stores a bit which is either a bit of 0 or a bit of 1. Each of the plurality of memory cells $301_{1, 2, \ldots, M}$ is electrically connected to WL 325, PL 335, and one of the M bit lines $BL_{1, 2, \ldots, M}$ $345_{1, 2, \ldots, M}$.

As shown in FIG. 3, the memory 300 further includes a first reference memory cell 402 and a second reference memory cell 404. In some embodiments, the first reference memory cell 402 and the second reference memory cell 404 are the same as or substantially similar to the plurality of memory cells $301_{1, 2, \ldots, M}$. In some embodiments, both the first reference memory cell 402 and the second reference memory cell 404 are ferroelectric memory cells. In some embodiments, the first reference memory cell 402 stores the bit of 1, as the second reference memory cell 404 stores the bit of 0. The first reference memory cell 402 is electrically connected to the first reference bit line $BL_{r0}$ $345_{M+1}$, the word line WL 325 and the plate line PL 335. The second reference memory cell 404 is electrically connected to the second reference bit line $BL_{r1}$ $345_{M+2}$, the word line WL 325 and the plate line PL 335. In some embodiments, the first reference bit line, $BL_{r0}$ $345_{M+1}$, and the second reference bit line, $BL_{r1}$ $345_{M+2}$, are designed to be identical with or substantially similar to $BL_{1, 2, \ldots, M}$ in FIG. 3.

Although FIG. 3 shows only one word line (i.e., WL 325) and only one plate line (i.e., PL 335) included in the memory 300, the numbers of the WLs 325 and the PLs 335 included in the memory 300 are not limiting. For example, the memory 300 may include N WLs 325, and N PL 335, where N is a positive integer. Accordingly, the memory 300 may include N*M memory cells $301_{1, 2, \ldots, M}$, N first reference memory cells 402, and N second reference memory cells 404. Each of the N*M memory cells is electrically connected to one of the M bit lines $BL_{1, 2, \ldots, M}$ $301_{1, 2, \ldots, M}$, one of N WLs 325, and one of N PLs 335. Each of the N first reference memory cells 402 is electrically connected to $BL_{r0}$ $345_{M+1}$, one of the N WLs 325, and one of the N PLs 335. Each of the N second reference memory cells 404 is electrically connected to $BL_{r1}$ $345_{M+2}$, one of the N WLs 325, and one of the N PLs 335. In some embodiments, N can be any positive integer.

The memory 300 further includes a WL driver 320, a PL driver 330, and a BL driver 340. The WL driver 320 is configured to generate a word line signal and apply the word line signal to WL 325, to select memory cells $301_{1, 2, \ldots, M}$ electrically connected to WL 325. The PL driver 330 is configured to generate a plate line signal and apply the plate line signal to PL 335 according to a plate line time sequence (i.e., a plate line coding). The plate line signal can be applied through PL 335 to polarize the memory cells $301_{1, 2, \ldots, M}$. The BL driver 340 is configured to generate a bit line signal and apply the bit line signal to each bit line of $BL_{1, 2, \ldots, M} 345_{1, 2, \ldots, M}$ according to a respective bit line time sequence (i.e., a respective bit line coding) to write a valid state of data into a respective memory cell $301_{1, 2, \ldots, M}$ during the write operation. In some embodiments, each bit line signal is an analog voltage signal between 0 V and the supply voltage Vdd (>0). During the read operation, each bit line signal can be obtained by sensing data stored in a respective memory cell $301_{1, 2, \ldots, M}$ through the respective bit line of $BL_{1, 2, \ldots, M}$.

In some embodiments, the memory 300 further includes a coordination circuit 370 electrically connected to the WL driver 320, the PL driver 330, and the BL driver 340. The coordination circuit 370 is configured to coordinate the WL driver 320, the PL driver 330, and the BL driver 340 to drive the plurality of memory cells $301_{1, 2, \ldots, M}$, the first reference memory cell 402, and the second reference memory cell 404 during the read operations. In some embodiments, the coordination circuit 370 is further electrically connected to a charge sharing circuit 360 and is configured to apply a set of values on one or more parameters corresponding to one or more components of the charge sharing circuit 360. The charge sharing circuit 360 is further configured to provide electrical charges, a total amount of which is denoted by Q, to a plurality of gate terminals of a plurality of transistors $305_{1, 2, \ldots, M}$. As shown in FIG. 3, the amount of electrical charges provided to a first transistor $305_1$, a second transistor $305_2$, . . . , and an $M_{th}$ transistor $305_M$ is $Q_1, Q_2, \ldots,$ and $Q_M$, respectively. In some embodiments, $Q=Q_1+Q_2+ \ldots +Q_M$. More details regarding the charge sharing circuit 360 will be further discussed.

The memory 300 further includes a plurality of voltage-to-current converters $303_{1, 2, \ldots, M}$ denoted by $VI_{1, 2, \ldots, M}$ as shown in FIG. 3. Each of the plurality of voltage-to-current converters $303_{1, 2, \ldots, M}$ is electrically connected to a respective bit line of $BL_{1, 2, \ldots, M} 345_{1, 2, \ldots, M}$. In some embodiments, each of the plurality of voltage-to-current converters $303_{1, 2, \ldots, M}$ is configured to convert a voltage of data, i.e., a bit line signal sensed from a respective memory cell $301_{1, 2, \ldots, M}$ through a respective bit line of BLs $345_{1, 2, \ldots, M}$ to a current denoted by $I_{1, 2, \ldots, M}$. As shown in FIG. 3, the currents $I_{1, 2, \ldots, M}$ have directions toward the voltage-to-current converters $303_{1, 2, \ldots, M}$. In some embodiments, the directions of the currents $I_{1, 2, \ldots, M}$ may be inverted.

The memory 300 further includes the plurality of transistors $305_{1, 2, \ldots, M}$, a plurality of current comparator circuits $307_{1, 2, \ldots, M}$, a reference circuit 350, and the charge sharing circuit 360. Each of the plurality of transistors $305_{1, 2, \ldots, M}$ includes a gate terminal denoted by $G_{1, 2, \ldots, M}$, a drain terminal denoted by $D_{1, 2, \ldots, M}$, and a source terminal denoted by $S_{1, 2, \ldots, M}$. As shown, the source terminals $S_{1, 2, \ldots, M}$ are grounded. The gate terminals $G_{1, 2, \ldots, M}$ are electrically connected with each other. The gate terminals $G_{1, 2, \ldots, M}$ are further connected to the reference circuit 350 and the charge sharing circuit 360. The drain terminals $D_{1, 2, \ldots, M}$ are connected to the current comparator circuits $307_{1, 2, \ldots, M}$. The plurality of transistors $305_{1, 2, \ldots, M}$ are configured to generate, together with the reference circuit 350, a plurality of reference currents denoted by $I_{REF1, 2, \ldots, M}$. The plurality of transistors $305_{1, 2, \ldots, M}$ are further configured to output the plurality of reference currents $I_{REF1, 2, \ldots, M}$. As shown, the plurality of reference currents $I_{REF1, 2, \ldots, M}$ have directions toward the plurality of transistors $305_{1, 2, \ldots, M}$. In some embodiments, the directions of the plurality of reference currents $I_{REF1, 2, \ldots, M}$ may be toward the plurality of current comparator circuits $307_{1, 2, \ldots, M}$.

The plurality of current comparator circuits $307_{1, 2, \ldots, M}$ are coupled to the plurality of voltage-to-current converters $303_{1, 2, \ldots, M}$ and the plurality of transistors $305_{1, 2, \ldots, M}$. Each of the plurality of current comparator circuits $307_{1, 2, \ldots, M}$ is configured to provide a respective output data $O_{1, 2, \ldots, M}$ based on a respective current $I_{1, 2, \ldots, M}$ and a respective reference current $I_{REF1, 2, \ldots, M}$. In some embodiments, the respective output data is the bit of 1 when the respective current is smaller than the respective reference current, as the respective output data is the bit of 0 when the respective current is greater than or equal to the respective reference current. In some embodiments, the respective output data is the bit of 0 when the respective current is smaller than the respective reference current, as the respective output data is the bit of 1 when the respective current is greater than or equal to the respective reference current. In some embodiments, the plurality of current comparator circuits $307_{1, 2, \ldots, M}$ are a plurality of sense amplifiers. In some embodiments, each of the plurality of current comparator circuits $307_{1, 2, \ldots, M}$ includes a sense amplifier.

In some embodiments, the plurality of bit lines $BL_{1, 2, \ldots, M} 345_{1, 2, \ldots, M}$, the first reference bit line $BL_{r0} 345_{M+1}$, and the second reference bit line $BL_{r1} 345_{M+2}$ are designed to be identical with or substantially similar to each other. In some embodiments, the plurality of memory cells $301_{1, 2, \ldots, M}$, the first reference memory cell 402, and the second reference memory cell 404 are designed to be identical with or substantially similar to each other. In some embodiments, the plurality of voltage-to-current converters $303_{1, 2, \ldots, M}$ are designed to be identical with or substantially similar to each other. In some embodiments, the plurality of current comparator circuits $307_{1, 2, \ldots, M}$ are designed to be identical with or substantially similar to each other.

Figure 4:
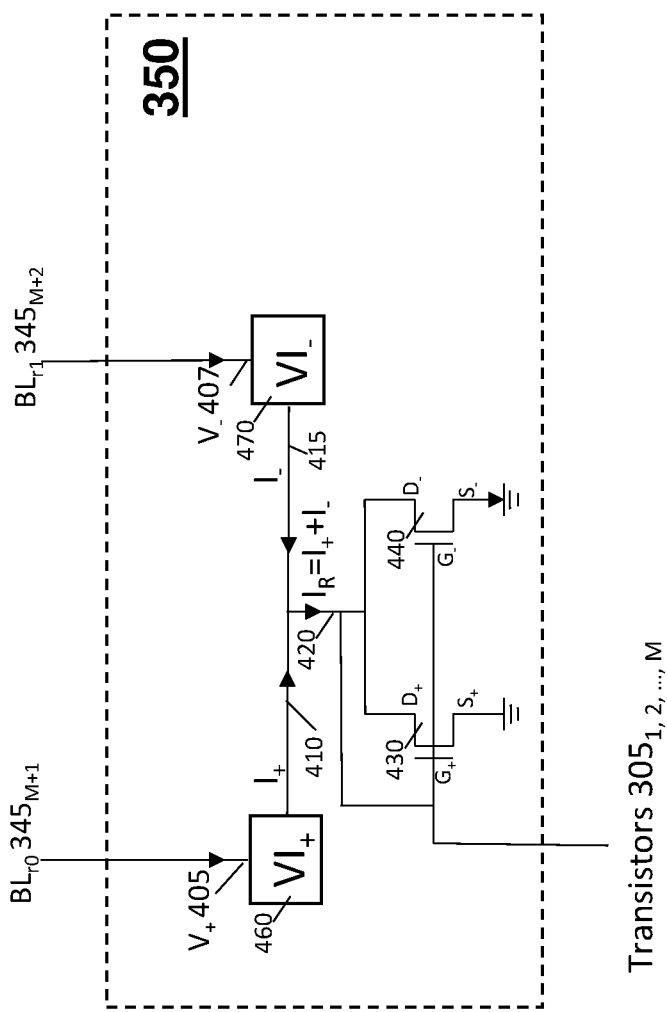
FIG. 4 illustrates a circuit diagram of an exemplary reference circuit according to some embodiments of the present disclosure.

FIG. 4 illustrates a circuit diagram of the reference circuit 350, according to some embodiments of the present disclosure. The reference circuit 350 includes a first voltage-to-current converter 460 and a second voltage-to-current converter 470. In some embodiments, the first voltage-to-current converter 460 and the second voltage-to-current converter 470 are designed to be identical with or substantially similar to the plurality of voltage-to-current converters $303_{1, 2, \ldots, M}$. The first voltage-to-current converter 460 is configured to convert a first voltage 405, denoted by $V_+$, of data sensed from the first reference memory cell 402 through $BL_{r0} 345_{M+1}$ to a first current 410 denoted by $I_+$. The second voltage-to-current converter 470 is configured to convert a second voltage 407, denoted by $V_-$, of data sensed from the second reference memory cell 404 through $BL_{r1} 345_{M+2}$ to a second current 415 denoted by $I_-$. A combined current 420 of the first current 410 and the second current 415 is denoted by $I_R = I_+ + I_-$.

The reference circuit 350 further includes a first transistor 430 and a second transistor 440. The drain terminal of the first transistor 430, denoted by $D_+$, is coupled to the drain terminal of the second transistor 440, denoted by $D_+$. The source terminal of the first transistor 430, denoted by $S_+$ and the source terminal of the second transistor 440, denoted by S_, are both grounded. The gate terminal of the first transistor 430, denoted by $G_+$, and the gate terminal of the second transistor 440, denoted by $G_-$, are electrically connected with each other and the drain terminals of the first transistor 430 and the second transistor 440, $D_+$ and $D_-$, which are also connected with the plurality of transistors $305_{1, 2, \ldots, M}$ in FIG. 3. The plurality of reference currents, $I_{REF1, 2, \ldots, M}$, which are provided by the plurality of transistors $305_{1, 2, \ldots, M}$, are one half of the combined current 420. That is, $I_{REF1, 2, \ldots, M} = 0.5*(I_+ + I_-)$.

Figure 5:
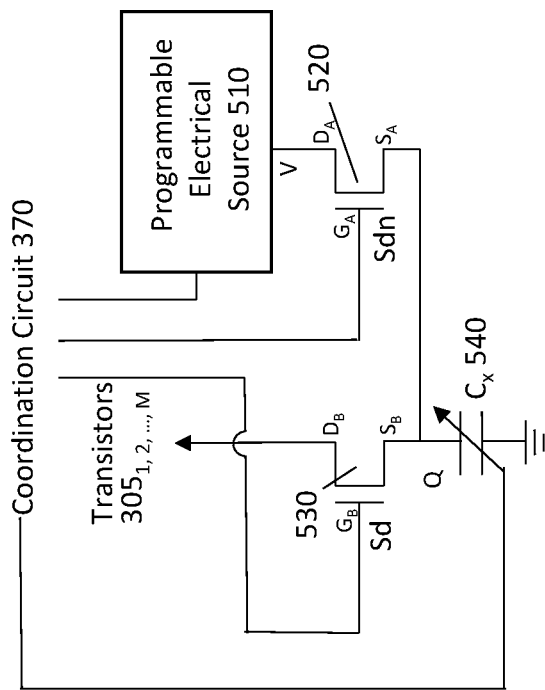
FIG. 5 illustrates a circuit diagram of an exemplary charge sharing circuit according to some embodiments of the present disclosure.

FIG. 5 illustrates a circuit diagram of the charge sharing circuit 360, according to some embodiments of the present disclosure. As shown in FIG. 5, the charge sharing circuit 360 is coupled to the coordination circuit 370. The charge sharing circuit 360 is also coupled to the plurality of transistors $305_{1, 2, \ldots, M}$ through the plurality of gate terminals of the plurality of transistors $305_{1, 2, \ldots, M}$. As described above, the coordination circuit 370 is configured to apply a set of values on one or more parameters of one or more components of the charge share circuit 360. The one or more components of the charge share circuit 360 include a programmable electrical source 510, a first switch 520, a capacitor 540, and a second switch 530, all of which are coupled to the coordination circuit 370. The programmable electrical source 510 is configured to provide electrical charges to the capacitor 540 when the first switch 520 is turned on and the second switch 530 is turned off. In some embodiments, the programmable electrical source 510 is a tunable voltage source. Accordingly, the amount of electrical charges, denoted by Q, from the programmable electrical source 510 to the capacitor 540 is equal to a multiplication of the capacitance, denoted by $C_x$, of the capacitor 540 and the voltage, denoted by V, outputted by the programmable electrical source 510. Subsequently, when the first switch 520 is turned off and the second switch 530 is turned on, a portion of or all the electrical charges, Q, on the capacitor 540 are provided to (or shared among) the plurality of gate terminals of the plurality of transistors $305_{1, 2, \ldots, M}$. In some embodiments, the first switch 520 and the second switch 530 are not turned on at the same time. In other words, when the first switch 520 is turned on, the second switch 530 is turned off. When the second switch 530 is turned on, the first switch 520 is turned off.

The one or more parameters of the one or more components of the charge share circuit 360 include an amplitude of the voltage, V, outputted by the programmable electrical source 510, the capacitance, $C_x$, of the capacitor 540, a first time to turn on the first switch 520 and turn off the second switch 530, a first period of time for turning on the first switch 520 and turning off the second switch 530, a second time to turn on the second switch 530 and turn off the first switch 520, and a second period of time for turning on the second switch 530 and turning off the first switch 520.

In some embodiments, the first switch 520 and the second switch 530 are metal oxide semiconductor field effect transistors (MOSFETs). In some embodiments, the first switch 520 and the second switch 530 are N-type MOSFETs (NMOS transistors). As shown in FIG. 5, the coordination circuit 370 is coupled to the first switch 520 through the gate terminal, denoted by $G_A$, of the first switch 520. The coordination circuit 370 is coupled to the second switch 530 through the gate terminal, denoted by $G_B$, of the second switch 530. The first switch 520 is coupled to the programmable electrical source 510 through the drain terminal, denoted by $D_A$, of the first switch 520. The first switch 520 is coupled to the capacitor 540 through the source terminal, denoted by SA, of the first switch 520. The second switch 530 is coupled to the first switch 520 and the capacitor 540 through the source terminal, denoted by $S_B$, of the second switch 530. The second switch is coupled to the plurality of gate terminals of the plurality of transistors $305_{1, 2, \ldots, M}$ through the drain terminal, denoted by $D_B$, of the second switch 530. In some embodiments, the coordination circuit 370 is configured to adjust an amplitude of the voltage outputted by the programmable electrical source 510. In some embodiments, the coordination circuit 370 is configured to apply a first control signal, denoted by Sdn, to the first switch 520 and a second control signal, denoted by Sd, to the second switch 530.

In some embodiments, the coordination circuit 370 is configured to turn on the first switch 520 and turn off the second switch 530 by applying the first control signal, Sdn, with the supply voltage, Vdd, to the gate terminal, $G_A$, of the first switch 520 and applying the second control signal, Sd, with 0 V, to the gate terminal, $G_B$, of the second switch 530. The coordination circuit 370 is configured to turn on the first switch 520 and turn off the second switch 530 at the first time by applying the first control signal, Sdn, with the supply voltage, Vdd, to the gate terminal, $G_A$, of the first switch 520 and applying the second control signal, Sd, with 0 V, to the gate terminal, $G_B$, of the second switch 530 at the first time. The coordination circuit 370 is configured to turn on the first switch 520 and turn off the second switch 530 for the first period of time by applying the first control signal, Sdn, with the supply voltage, Vdd, to the gate terminal, $G_A$, of the first switch 520 and applying the second control signal, Sd, with 0 V, to the gate terminal, $G_B$, of the second switch 530 for the first period of time following the first time. The coordination circuit 370 is configured to adjust the capacitance, $C_x$, of the capacitor 540 by, for example, adjusting a distance between the two electrodes of the capacitor 540.

In some embodiments, the coordination circuit 370 is configured to turn on the second switch 530 and turn off the first switch 520 by applying the second control signal, Sd, with the supply voltage, Vdd, to the gate terminal, $G_B$, of the second switch 530 and applying the first control signal, Sdn, with 0 V, to the gate terminal, $G_A$, of the first switch 520. The coordination circuit 370 is configured to turn on the second switch 530 and turn off the first switch 520 at the second time by applying the second control signal, Sd, with the supply voltage, Vdd, to the gate terminal, $G_B$, of the second switch 530 and applying the first control signal, Sdn, with 0 V, to the gate terminal, $G_A$, of the first switch 520 at the second time. The coordination circuit 370 is configured to turn on the second switch 530 and turn off the first switch 520 for the second period of time by applying the second control signal, Sd, with the supply voltage, Vdd, to the gate terminal, $G_B$, of the second switch 530 and applying the first control signal, Sdn, with 0 V, to the gate terminal, $G_A$, of the first switch 520 for the second period of time following the second time.

Figure 6:
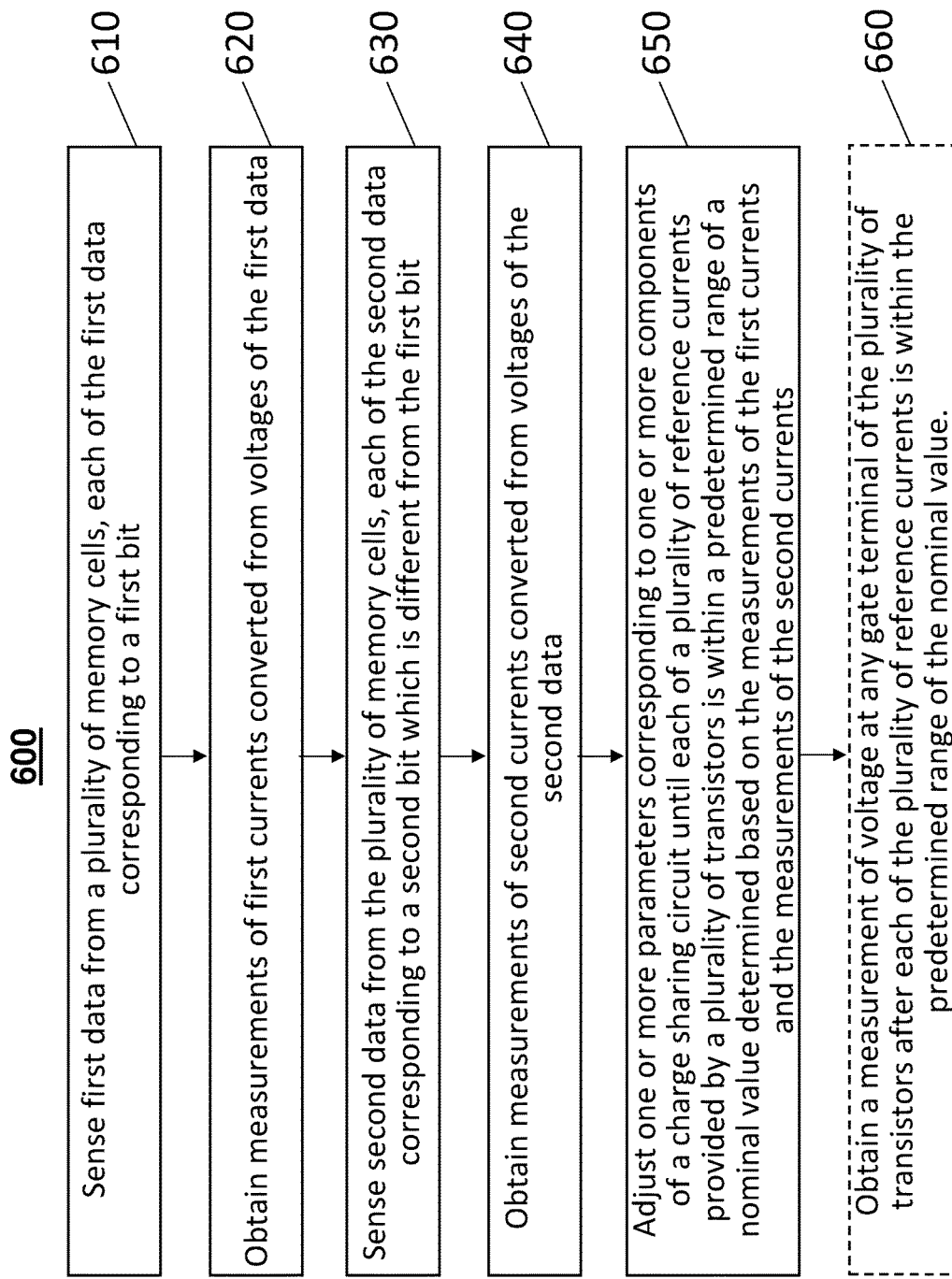
FIG. 6 is a flowchart of an exemplary method for calibrating a memory prior to operating the memory to read data in memory cells, according to some embodiments of the present disclosure.

FIG. 6 is a flowchart of an exemplary method 600 for calibrating a memory prior to operating the memory to read data in the memory cells, according to some embodiments of the present disclosure. As described above, the reference memory cells 402 and 404 in FIG. 3 should be identical with or substantially similar to each other. However, a mismatch between the reference memory cells 402 and 404 may be possible due to various reasons including defects in the manufacturing process. In addition, a similar mismatch may occur between the plurality of bit lines $BL_{1, 2, \ldots, M}$ 3 $45_{1, 2, \ldots, M}$, the first reference bit line $BL_{r0}$ $345_{M+1}$, and the second reference bit line $BL_{r1}$ $345_{M+2}$; between the plurality of cells including the plurality of memory cells $D_{1, 2, \ldots, M}$ $301_{1, 2, \ldots, M}$, the first reference memory cell 402, and the second reference memory cell 404; between the plurality of voltage-to-current converters $303_{1, 2, \ldots, M}$; between the plurality of current comparator circuits $307_{1, 2, \ldots, M}$; between the plurality of transistors $305_{1, 2, \ldots, M}$; and between the first voltage-to-current converter 460 and the second voltage-to-current converter 470. This may adversely affect the accuracy and reliability of the output data $O_{1, 2, \ldots, M}$ in FIG. 3. The method 600 may be implemented to resolve this problem. Examples of the memory include the memory 300 in FIG. 3. It should be understood that the operations shown in method 600 are not exhaustive and that other operations can be performed as well before, after, or between any of the illustrated operations. Further, some of the operations may be performed simultaneously, or in a different order than shown in FIG. 6.

Referring to FIG. 6, method 600 starts at operation 610, in which first data from a plurality of memory cells is sensed. Each of the first data corresponds to a first bit. In some embodiments, the first bit is a bit of 1. In some embodiments, the first bit is a bit of 0. In some embodiments, the plurality of memory cells are the plurality of memory cells $301_{1, 2, \ldots, M}$. In some embodiments, the plurality of memory cells are a plurality of ferroelectric memory cells. In some embodiments, the first data is sensed by the BL driver 340 through the plurality of bit lines $BL_{1, 2, \ldots, M} 345_{1, 2, \ldots, M}$. In some embodiments, the first bit is stored in each of the plurality of memory cells before operation 610 is implemented.

Method 600 proceeds to operation 620, as illustrated in FIG. 6, in which measurements of first currents converted from voltages of the first data are obtained. In some embodiments, the voltages of the first data are converted to the first currents by a plurality of voltage-to-current converters, for example, the voltage-to-current converters $303_{1, 2, \ldots, M}$. The measurements of first currents may be denoted by $I_{1,1}$, $I_{2,1}, \ldots$, and $I_{M,1}$. In some embodiments, the measurements of first currents are performed by a plurality of ammeters.

Method 600 proceeds to operation 630, as illustrated in FIG. 6, in which second data from the plurality of memory cells is sensed. Each of the second data corresponds to a second bit which is different from the first bit. In some embodiments, when the first bit is the bit of 1, the second bit is the bit of 0. When the first bit is the bit of 0, the second bit is the bit of 1. In some embodiments, the plurality of memory cells are the plurality of memory cells $301_{1, 2, \ldots, M}$. For example, the second data is sensed by the BL driver 340 through the plurality of bit lines $345_{1, 2, \ldots, M} BL_{1, 2, \ldots, M}$. In some embodiments, the second bit is stored in each of the plurality of memory cells (and replace the first bit) after operation 620 is complete and before operation 630 is implemented.

Method 600 proceeds to operation 640, as illustrated in FIG. 6, in which measurements of second currents converted from voltages of the second data are obtained. In some embodiments, the voltages of the second data are converted to the second currents by a plurality of voltage-to-current converters, for example, the voltage-to-current converters $303_{1, 2, \ldots, M}$. The measurements of second currents may be denoted by $I_{1,2}$, $I_{2,2}, \ldots$, and $I_{M,2}$. In some embodiments, the measurements of second currents are performed by a plurality of ammeters.

Method 600 proceeds to operation 650, as illustrated in FIG. 6, in which one or more parameters corresponding to one or more components of a charge sharing circuit are adjusted until each of a plurality of reference currents provided by a plurality of transistors is within a predetermined range of a nominal value determined based on the measurements of first currents and the measurements of second currents. In some embodiments, the one or more components of the charge sharing circuit are selected from a group consisting of a programmable electrical source, a first switch coupled to the programmable electrical source, a capacitor coupled to the first switch, and a second switch coupled to the first switch, the capacitor, and a plurality of gate terminals of the plurality of transistors. In some embodiments, the one or more parameters corresponding to the one or more components of the charge sharing circuit are selected from a group consisting of an amplitude of a voltage outputted by the programmable electrical source, a capacitance of the capacitor, a first time to turn on the first switch and turn off the second switch, a first period of time for turning on the first switch and turning off the second switch, a second time to turn on the second switch and turn off the first switch, and a second period of time for turning on the second switch and turning off the first switch. In some embodiments, both the first switch and the second switch are NMOS transistors.

In some embodiments, an amplitude of a voltage outputted by the programmable electrical source 510 is adjusted until each of the plurality of reference currents $I_{REF1, 2, \ldots, M}$ provided by the plurality of transistors $305_{1, 2, \ldots, M}$ is within the predetermined range of the nominal value. In addition or alternatively, the second period of time for turning on the second switch 530 and turning off the first switch 520 and/or the capacitance of the capacitor 540 may be adjusted until each of the plurality of reference currents $I_{REF1, 2, \ldots, M}$ provided by the plurality of transistors $305_{1, 2, \ldots, M}$ is within the predetermined range of the nominal value.

In some embodiments, the nominal value is determined by dividing one half of a sum of the measurements of first currents, for example, $I_{1,1}, I_{2,1}, \ldots, I_{M,1}$ and the measurements of second currents, for example, $I_{1,2}, I_{2,2}, \ldots, I_{M,2}$ by a number of memory cells included in the plurality of memory cells, for example, M.

In some embodiments, method 600 is complete after operation 650 is implemented. In some embodiments, after operation 650, method 600 proceeds to operation 660, in which a measurement of the voltage at any gate terminal of the plurality of transistors is obtained after each of the plurality of reference currents is determined within the predetermined range of the nominal value. For example, a measurement of the voltage at any gate terminal $G_{1, 2, \ldots, M}$ of the plurality of transistors $305_{1, 2, \ldots, M}$ is perform by a voltmeter. The measurement of the voltage at operation 650 may suggest the voltage at the plurality of gate terminals, for example, the gate terminals $G_{1, 2, \ldots, M}$ of the plurality of transistors, for example, the transistors $305_{1, 2, \ldots, M}$ when the plurality of transistors operate at steady states.

Figure 7:
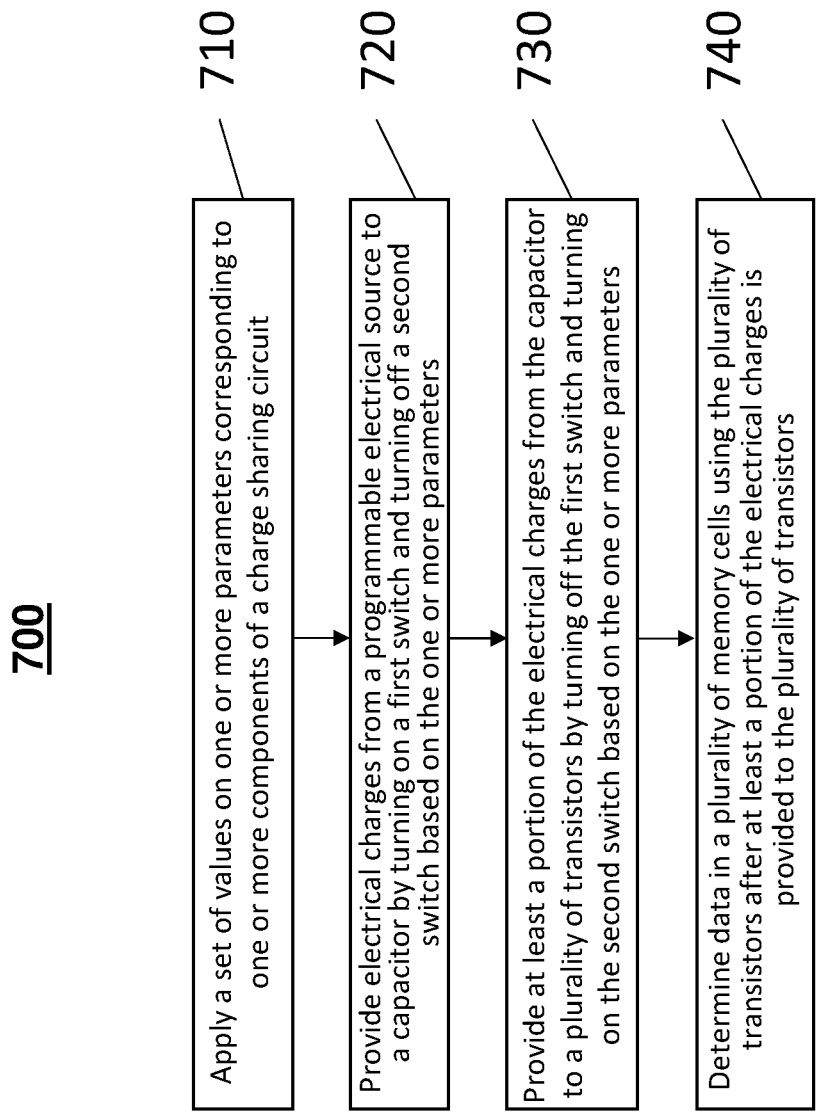
FIG. 7 is a flowchart of an exemplary method for operating a memory for reading data in memory cells, according to some embodiments of the present disclosure.

FIG. 7 is a flowchart of an exemplary method 700 for operating a memory for reading data in memory cells in the memory, according to some embodiments of the present disclosure. In some embodiments, the memory is a ferroelectric memory. In some embodiments, the memory cells are ferroelectric memory cells. In some embodiments, the memory is the memory 300 in FIG. 3. It should be understood that the operations shown in method 700 are not exhaustive and that other operations can be performed as well before, after, or between any of the illustrated operations. Further, some of the operations may be performed simultaneously, or in a different order than shown in FIG. 7.

Referring to FIG. 7, method 700 starts at operation 710, in which a set of values is applied on one or more parameters corresponding to one or more components of a charge sharing circuit. In some embodiments, the one or more components include a programmable electrical source, a first switch coupled to the programmable electrical source, a capacitor coupled to the first switch, and/or a second switch coupled to the first switch and the capacitor. In some embodiments, the one or more parameters include an amplitude of a voltage outputted by the programmable electrical source, a capacitance of the capacitor, a first time to turn on the first switch and turn off the second switch, a first period of time for turning on the first switch and turning off the second switch, a second time to turn on the second switch and turn off the first switch, and/or a second period of time for turning on the second switch and turning off the first switch. In some embodiments, the set of values with respect to the one or more parameters of one or more components of the charge sharing circuit are determined at operation 650 of method 600 in FIG. 6. In some embodiments, operation 710 is performed by a coordination circuit, for example, the coordination circuit 370 in FIG. 3. In some embodiments, the charge sharing circuit is the charge sharing circuit 360. In some embodiments, the programmable electrical source is the programmable electrical source 510, the first switch is the first switch 520, the capacitor is the capacitor 540, the second switch is the second switch 530, and the plurality of transistors are the plurality of transistors $305_{1, 2, \ldots, M}$.

Method 700 proceeds to operation 720, in which electrical charges are provided from the programmable electrical source to the capacitor by turning on the first switch and turning off the second switch based on the one or more parameters. In some embodiments, both the first switch and the second switch are NMOS transistors. In some embodiments, the amount of electrical charges provided from the programmable electrical source to the capacitor is equal to a multiplication of the capacitance of the capacitor and the amplitude of voltage outputted by the programmable electrical source.

Method 700 proceeds to operation 730, in which at least a portion of the electrical charges is provided from the capacitor to a plurality of gate terminals of a plurality of transistors by turning off the first switch and turning on the second switch based on the one or more parameters. This is done so that the voltage outputted by the programmable electrical source is applied to the plurality of gate terminals of the transistors spontaneously at the time the first switch is turned off and the second switch is turned on. The amount of electrical charges provided from the capacitor to the plurality of transistors depends on the second period of time during which the second switch is turned off, and the first switch is turned on. As described above, the second period of time at operation 730 in method 700 may be determined at operation 650 in method 600. In some embodiments, the capacitor is the capacitor 540. In some embodiments, the plurality of gate terminals of the plurality of transistors are the plurality of gate terminals $G_{1, 2, \ldots, M}$ of the plurality of transistors $305_{1, 2, \ldots, M}$. In some embodiments, the first switch is the first switch 520. In some embodiments, the second switch is the second switch 530.

Method 700 proceeds to operation 740, in which data in a plurality of memory cells are determined using the plurality of transistors after the at least a portion of the first electrical charges is provided to the plurality of gate terminals of the plurality of transistors. In some embodiments, the plurality of memory cells are the plurality of memory cells $301_{1, 2, \ldots, M}$. In some embodiments, the plurality of transistors are the plurality of transistors $305_{1, 2, \ldots, M}$. In some embodiments, operation 740 is performed by the current comparator circuit $307_{1, 2, \ldots, M}$.

Figure 8:
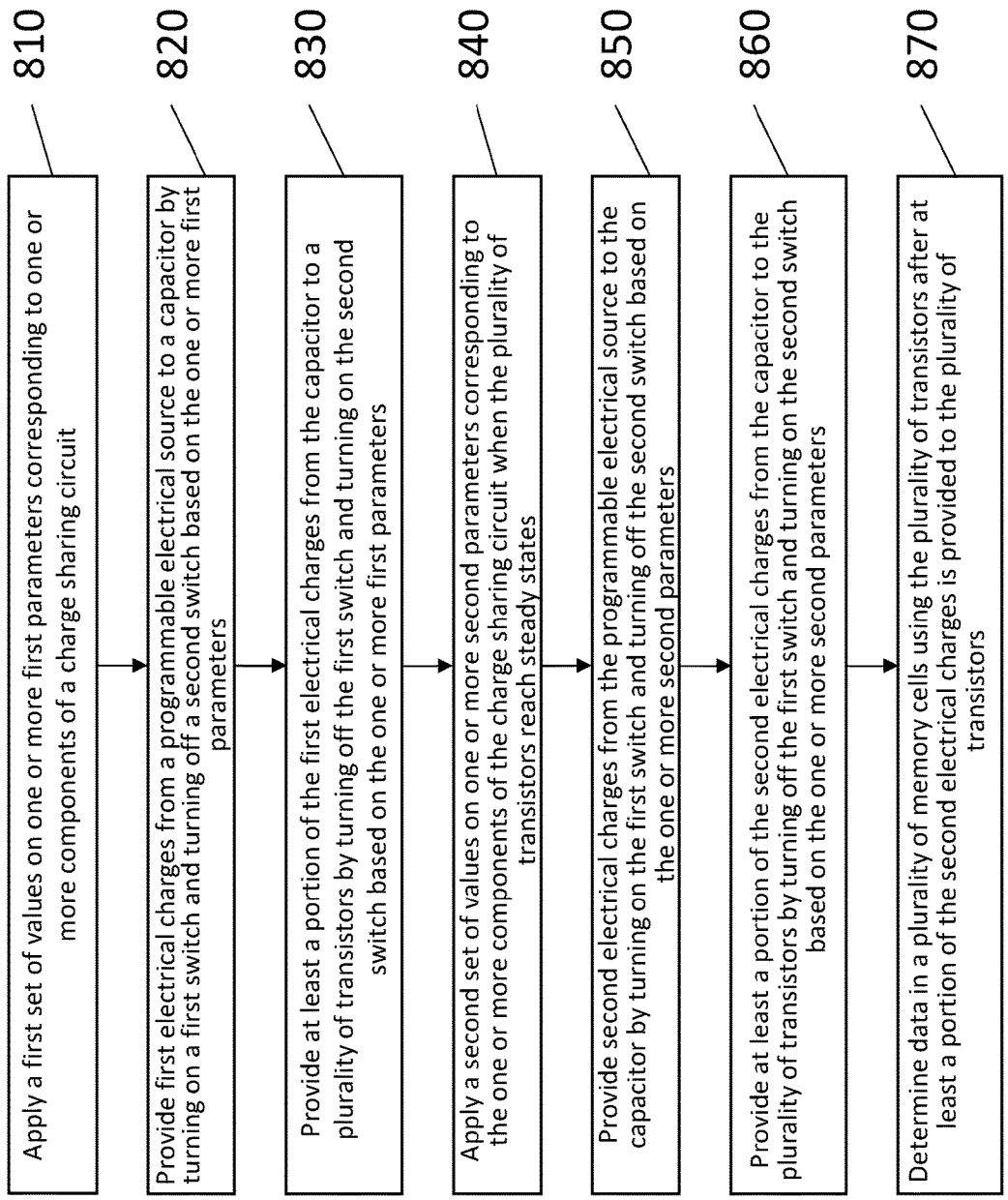
FIG. 8 is a flowchart of another exemplary method for operating a memory for reading data in memory cells, according to some embodiments of the present disclosure.

FIG. 8 is a flowchart of another exemplary method 800 for operating a memory for reading data in memory cells in the memory, according to some embodiments of the present disclosure. In some embodiments, the memory is a ferroelectric memory. In some embodiments, the memory cells are ferroelectric memory cells. In some embodiments, the memory is the memory 300 in FIG. 3. It should be understood that the operations shown in method 800 are not exhaustive and that other operations can be performed as well before, after, or between any of the illustrated operations. Further, some of the operations may be performed simultaneously, or in a different order than shown in FIG. 8.

Referring to FIG. 8, method 800 starts at operation 810, in which a first set of values is applied on one or more first parameters corresponding to one or more components of a charge sharing circuit. In some embodiments, the one or more components include a programmable electrical source, a first switch coupled to the programmable electrical source, a capacitor coupled to the first switch, and/or a second switch coupled to the first switch and the capacitor. In some embodiments, the one or more first parameters include an amplitude of a voltage outputted by the programmable electrical source, a capacitance of the capacitor, a first time to turn on the first switch and turn off the second switch, a first period of time for turning on the first switch and turning off the second switch, a second time to turn on the second switch and turn off the first switch, and/or a second period of time for turning on the second switch and turning off the first switch. In some embodiments, operation 810 is performed by a coordination circuit, for example, the coordination circuit 370 in FIG. 3. In some embodiments, the charge sharing circuit is the charge sharing circuit 360. In some embodiments, the first set of values corresponding to the one or more components of the charge sharing circuit can be any appropriate values. In some embodiments, the amplitude of voltage outputted by the programmable electrical source is equal to or about the measurement of voltage obtained at operation 660 in method 600 in FIG. 6. In some embodiments, both the first switch and the second switch are NMOS transistors. In some embodiments, the charge sharing circuit is the charge sharing circuit 360. In some embodiments, the programmable electrical source is the programmable electrical source 510, the first switch is the first switch 520, the capacitor is the capacitor 540, the second switch is the second switch 530, and the plurality of transistors are the plurality of transistors $305_{1, 2, \ldots, M}$.

Method 800 proceeds to operation 820, in which first electrical charges are provided from the programmable electrical source to the capacitor by turning on the first switch and turning off the second switch based on the one or more first parameters. In some embodiments, the amount of first electrical charges provided from the programmable electrical source to the capacitor is equal to a multiplication of the capacitance of the capacitor and the amplitude of voltage outputted by the programmable electrical source according to the first set of values.

Method 800 proceeds to operation 830, in which at least a portion of the first electrical charges is provided from the capacitor to a plurality of gate terminals of a plurality of transistors by turning off the first switch and turning on the second switch based on the one or more first parameters. This is done so that the voltage outputted by the programmable electrical source is applied to the plurality of gate terminals of the transistors spontaneously at the time the first switch is turned off and the second switch is turned on. By doing so, the settling time required by the memory to reach a steady state (particularly, the settling time required by the plurality of transistors to reach steady states) is significantly reduced. Thus, the speed of the memory for reading data in the memory cells seems greatly increased. In some embodiments, the plurality of gate terminals of the plurality of transistors are the plurality of gate terminals $G_{1, 2, \ldots, M}$ of the plurality of transistors $305_{1, 2, \ldots, M}$. In some embodiments, the first switch is the first switch 520.

Referring to FIG. 8, method 800 starts at operation 840, in which a second set of values is applied on one or more second parameters corresponding to the one or more components of the charge sharing circuit when the plurality of transistors reach steady states. In some embodiments, the one or more components include the programmable electrical source, the first switch coupled to the programmable electrical source, the capacitor coupled to the first switch, and/or the second switch coupled to the first switch and the capacitor. In some embodiments, the one or more second parameters include an amplitude of a voltage outputted by the programmable electrical source, a capacitance of the capacitor, a first time to turn on the first switch and turn off the second switch, a first period of time for turning on the first switch and turning off the second switch, a second time to turn on the second switch and turn off the first switch, and/or a second period of time for turning on the second switch and turning off the first switch. In some embodiments, the second set of values with respect to the one or more second parameters of one or more components of the charge sharing circuit are determined at operation 650 of method 600 in FIG. 6. In some embodiments, operation 840 is performed by a coordination circuit, for example, the coordination circuit 370 in FIG. 3. In some embodiments, the charge sharing circuit is the charge sharing circuit 360. In some embodiments, the one or more second parameters are the one or more first parameters. In some embodiments, the charge sharing circuit is the charge sharing circuit 360. In some embodiments, the programmable electrical source is the programmable electrical source 510, the first switch is the first switch 520, the capacitor is the capacitor 540, the second switch is the second switch 530, and the plurality of transistors are the plurality of transistors $305_{1, 2, \ldots, M}$.

Method 800 proceeds to operation 850, in which second electrical charges are provided from the programmable electrical source to the capacitor by turning on the first switch and turning off the second switch based on the one or more second parameters. In some embodiments, the amount of second electrical charges provided from the programmable electrical source to the capacitor is equal to a multiplication of the capacitance of the capacitor and the amplitude of voltage outputted by the programmable electrical source according to the second set of values.

Method 800 proceeds to operation 860, in which at least a portion of the second electrical charges is provided from the capacitor to the plurality of gate terminals of the plurality of transistors by turning off the first switch and turning on the second switch based on the one or more second parameters. This is done so that the voltage outputted by the programmable electrical source is applied to the plurality of gate terminals of the transistors spontaneously at the time the first switch is turned off and the second switch is turned on. By doing so, the mismatch between various components of the memory as described above can be compensated based on the second set of data obtained from the calibration method as described in FIG. 6. Therefore, the reliability of the memory can be improved. In some embodiments, the capacitor is the capacitor 540. In some embodiments, the plurality of gate terminals of the plurality of transistors are the plurality of gate terminals $G_{1, 2, \ldots, M}$ of the plurality of transistors $305_{1, 2, \ldots, M}$.

Method 800 proceeds to operation 870, in which data in a plurality of memory cells are determined using the plurality of transistors after the at least a portion of the second electrical charges is provided to the plurality of gate terminals of the plurality of transistors. In some embodiments, the plurality of memory cells are the plurality of memory cells $301_{1, 2, \ldots, M}$. In some embodiments, the plurality of transistors are the plurality of transistors $305_{1, 2, \ldots, M}$. In some embodiments, operation 870 is performed by the current comparator circuit $307_{1, 2, \ldots, M}$.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. An apparatus comprising:
    a plurality of transistors; and
    a charge sharing circuit coupled to the plurality of transistors through a plurality of gate terminals of the plurality of transistors, the charge sharing circuit comprising:
        a programmable electrical source;
        a first switch coupled to the programmable electrical source;
        a capacitor coupled to the first switch; and
        a second switch coupled to the capacitor, the first switch, and the plurality of gate terminals of the plurality of transistors,
    wherein the programmable electrical source is configured to provide electrical charges to the capacitor when the first switch is turned on and the second switch is turned off,
    wherein the capacitor is configured to provide at least a portion of the electrical charges to the plurality of gate terminals of the plurality of transistors when the first switch is turned off and the second switch is turned on, and
    wherein each of the plurality of transistors is configured to generate a reference current at an input of a corresponding one current comparator of a plurality of current comparators.

2. The apparatus of claim 1, further comprising a coordination circuit coupled to the charge sharing circuit, the coordination circuit configured to apply a set of values on one or more parameters corresponding to the charge sharing circuit.

3. The apparatus of claim 2, wherein the one or more parameters corresponding to the charge sharing circuit are selected from a group consisting of an amplitude of a voltage outputted by the programmable electrical source, a capacitance of the capacitor, a first time to turn on the first switch and turn off the second switch, a first period of time for turning on the first switch and turning off the second switch, a second time to turn on the second switch and turn off the first switch, and a second period of time for turning on the second switch and turning off the first switch.

4. The apparatus of claim 3, further comprising:
a first reference memory cell storing a bit of 1;
a second reference memory cell storing a bit of 0; and
a reference circuit coupled to the plurality of transistors through the gate terminals of the plurality of transistors, coupled to the first reference memory cell through a first reference bit line, and coupled to the second reference memory cell through a second reference bit line.

5. The apparatus of claim 4, wherein the plurality of transistors are grounded through a plurality of source terminals of the plurality of transistors, the plurality of transistors configured to:
generate, together with the reference circuit, a plurality of reference currents; and
provide the plurality of reference currents.

6. The apparatus of claim 5, further comprising:
a plurality of memory cells, each of the plurality of memory cells storing a bit selected from a group consisting of a first bit and a second bit which is different from the first bit; and
a plurality of voltage-to-current converters coupled to the plurality of memory cells, the plurality of voltage-to-current converters configured to convert a plurality of voltages of data sensed from the plurality of memory cells to a plurality of currents,
wherein the plurality of current comparators comprise a respective plurality of current comparator circuits coupled to the plurality of voltage-to-current converters and the plurality of transistors through a plurality of drain terminals of the plurality of transistors, each of the plurality of current comparator circuits configured to output a respective output data based on a respective current provided by a respective voltage-to-current converter of the plurality of voltage-to-current converters and a respective reference current provided by a respective transistor of the plurality of transistors.

7. The apparatus of claim 6, wherein the plurality of memory cells are a plurality of ferroelectric memory cells.

8. The apparatus of claim 6, wherein each of the plurality of current comparator circuits comprises a sense amplifier.

9. The apparatus of claim 6, wherein the respective output data is a bit of 1 when the respective current is smaller than the respective reference current, and wherein the respective output data is a bit of 0 when the respective current is greater than or equal to the respective reference current.

10. An apparatus comprising:
a first reference memory cell storing a bit of 1;
a second reference memory cell storing a bit of 0;
a plurality of transistors;
a charge sharing circuit coupled to the plurality of transistors through a plurality of gate terminals of the plurality of transistors, the charge sharing circuit comprising:
a programmable electrical source;
a first switch coupled to the programmable electrical source;
a capacitor coupled to the first switch; and
a second switch coupled to the capacitor, the first switch, and the plurality of gate terminals of the plurality of transistors, wherein the programmable electrical source is configured to provide electrical charges to the capacitor when the first switch is turned on and the second switch is turned off, wherein the capacitor is configured to provide at least a portion of the electrical charges to the plurality of gate terminals of the plurality of transistors when the first switch is turned off and the second switch is turned on;
a coordination circuit coupled to the charge sharing circuit, the coordination circuit configured to apply a set of values on one or more parameters corresponding to the charge sharing circuit, wherein the one or more parameters corresponding to the charge sharing circuit are selected from a group consisting of an amplitude of a voltage outputted by the programmable electrical source, a capacitance of the capacitor, a first time to turn on the first switch and turn off the second switch, a first period of time for turning on the first switch and turning off the second switch, a second time to turn on the second switch and turn off the first switch, and a second period of time for turning on the second switch and turning off the first switch; and
a reference circuit coupled to the plurality of transistors through the gate terminals of the plurality of transistors, coupled to the first reference memory cell through a first reference bit line, and coupled to the second reference memory cell through a second reference bit line,
wherein the plurality of transistors are grounded through a plurality of source terminals of the plurality of transistors, the plurality of transistors configured to:
generate, together with the reference circuit, a plurality of reference currents; and
provide the plurality of reference currents.

11. The apparatus of claim 10, further comprising:
a plurality of memory cells, each of the plurality of memory cells storing a bit selected from a group consisting of a first bit and a second bit which is different from the first bit;
a plurality of voltage-to-current converters coupled to the plurality of memory cells, the plurality of voltage-to-current converters configured to convert a plurality of voltages of data sensed from the plurality of memory cells to a plurality of currents; and
a plurality of current comparator circuits coupled to the plurality of voltage-to-current converters and the plurality of transistors through a plurality of drain terminals of the plurality of transistors, each of the plurality of current comparator circuits configured to output a respective output data based on a respective current provided by a respective voltage-to-current converter of the plurality of voltage-to-current converters and a respective reference current provided by a respective transistor of the plurality of transistors.

12. The apparatus of claim 11, wherein the plurality of memory cells are a plurality of ferroelectric memory cells, wherein each of the plurality of current comparator circuits comprises a sense amplifier, and wherein the respective output data is a bit of 1 when the respective current is smaller than the respective reference current, and wherein the respective output data is a bit of 0 when the respective current is greater than or equal to the respective reference current.

13. A method comprising:
applying a first set of values on one or more first parameters corresponding to one or more components of a charge sharing circuit, wherein charge sharing circuit comprises a programmable electrical source, a first switch coupled to the programmable electrical source, a capacitor coupled to the first switch, and a second switch coupled to the first switch and the capacitor, and wherein the one or more components are selected from a group consisting of the programmable electrical source, the first switch coupled to the programmable electrical source, the capacitor coupled to the first switch, and the second switch coupled to the first switch and the capacitor;

providing first electrical charges from the programmable electrical source to the capacitor by turning on the first switch and turning off the second switch based on the one or more first parameters;

providing at least a portion of the first electrical charges from the capacitor to a plurality of gate terminals of a plurality of transistors by turning off the first switch and turning on the second switch based on the one or more first parameters; and determining data in a plurality of memory cells using the plurality of transistors after the at least a portion of the first electrical charges is provided to the plurality of gate terminals of the plurality of transistors, wherein each of the plurality of transistors is configured to generate a reference current at an input of a corresponding one current comparator of a plurality of current comparators.

14. The method of claim 13, wherein the one or more first parameters are selected from a group consisting of an amplitude of a voltage outputted by the programmable electrical source, a capacitance of the capacitor, a first time to turn on the first switch and turn off the second switch, a first period of time for turning on the first switch and turning off the second switch, a second time to turn on the second switch and turn off the first switch, and a second period of time for turning on the second switch and turning off the first switch.

15. The method of claim 14, further comprising determining the first set of values for the one or more first parameters corresponding to the one or more components of the charge sharing circuit, the determining the first set of values comprising:

sensing first data from the plurality of memory cells, each of the first data corresponding to a first bit;

obtaining measurements of first currents converted from voltages of the first data;

sensing second data from the plurality of memory cells, each of the second data corresponding to a second bit which is different from the first bit;

obtaining measurements of second currents converted from voltages of the second data; and adjusting the first set of values of the one or more first parameters corresponding to the one or more components of the charge sharing circuit until each of a plurality of reference currents provided by the plurality of transistors is within a predetermined range of a nominal value determined based on the measurements of first currents and the measurements of second currents.

16. The method of claim 15, further comprising:

determining the nominal value by dividing one half of a sum of the measurements of first currents and the measurements of second currents by a number of memory cells included in the plurality of memory cells.

17. The method of claim 16, wherein the first switch and the second switch are both N-type metal oxide semiconductor field effect (NMOS) transistors.

18. The method of claim 14, further comprising:

applying a second set of values on one or more second parameters corresponding to the one or more components of the charge sharing circuit when the plurality of transistors reach steady states;

providing second electrical charges from the programmable electrical source to the capacitor by turning on the first switch and turning off the second switch based on the one or more second parameters; and providing at least a portion of the second electrical charges to the plurality of gate terminals of the plurality of transistors by turning off the first switch and turning on the second switch based on the one or more second parameters.

19. The method of claim 18, wherein the plurality of memory cells are a plurality of ferroelectric memory cells, wherein the one or more second parameters are the one or more first parameters, and wherein the data in the plurality of memory cells is determined after the at least a portion of the second electrical charges is provided to the plurality of gate terminals of the plurality of transistors.

* * * * *